(12) United States Patent
Lu et al.

(10) Patent No.: US 12,777,709 B2
(45) Date of Patent: Oct. 27, 2026

US012777709B2

(54) MEMORY DEVICE AND MANUFACTURING METHOD THEREOF

(71) Applicant: Invention And Collaboration Laboratory Pte. Ltd., Singapore (SG)

(72) Inventors: Chao-Chun Lu, Singapore (SG); Li-Ping Huang, Singapore (SG); Wen-Hsien Tu, Singapore (SG)

(73) Assignee: Invention And Collaboration Laboratory Pte. Ltd., Singapore (SG)

(*) Notice: Subject to any disclaimer, the term of this patent is extended or adjusted under 35 U.S.C. 154(b) by 494 days.

(21) Appl. No.: 18/472,238

(22) Filed: Sep. 22, 2023

(65) Prior Publication Data

US 2024/0107746 A1 Mar. 28, 2024

Related U.S. Application Data

(60) Provisional application No. 63/409,243, filed on Sep. 23, 2022.

(51) Int. Cl.
*H10D 84/85* (2025.01)
*H10B 12/00* (2023.01)
(Continued)

(52) U.S. Cl.
CPC ......... *H10D 84/854* (2025.01); *H10B 12/033* (2023.02); *H10B 12/315* (2023.02); (Continued)

(58) Field of Classification Search
None
See application file for complete search history.

(56) References Cited

U.S. PATENT DOCUMENTS

2016/0163796 A1 6/2016 Obradovic et al.
2019/0027482 A1* 1/2019 Kim ...................... H10B 12/50
(Continued)

FOREIGN PATENT DOCUMENTS

KR 20000040719 7/2000
KR 20190010807 1/2019
TW 202207394 2/2022

OTHER PUBLICATIONS

"Office Action of Korea Counterpart Application", issued on Dec. 9, 2024, p. 1-p. 7.

(Continued)

*Primary Examiner* — Nicholas J Tobergte
(74) *Attorney, Agent, or Firm* — JCIPRNET

(57) ABSTRACT

A memory device and a manufacturing method thereof are provided. The memory device includes an access transistor defined within an active region of a semiconductor substrate and a storage capacitor disposed on the access transistor. A recessed gate structure of the access transistor extends into the active region from above the active region. Source/drain contacts of the access transistor are disposed on the active region at opposite sides of the recessed gate structure. The storage capacitor includes: a composite bottom electrode, formed by alternately stacked first conductive layers and second conductive layers, wherein each second conductive layer is sandwiched between a pair of the first conductive layers, and tunnels laterally extend through the second conductive layers, respectively; a capacitor dielectric layer, covering inner and outer surfaces of the composite bottom electrode; and a top electrode, in contact with the composite bottom electrode through the capacitor dielectric layer.

18 Claims, 13 Drawing Sheets

(51) Int. Cl.

| | |
|---|---|
| ***H10D 30/60*** | (2025.01) |
| ***H10D 30/69*** | (2025.01) |
| ***H10D 62/00*** | (2025.01) |
| ***H10D 62/10*** | (2025.01) |
| ***H10D 62/13*** | (2025.01) |
| ***H10D 62/17*** | (2025.01) |
| ***H10D 64/23*** | (2025.01) |

(52) U.S. Cl.
CPC ......... *H10D 30/605* (2025.01); *H10D 30/792* (2025.01); *H10D 30/797* (2025.01); *H10D 62/021* (2025.01); *H10D 62/116* (2025.01); *H10D 62/154* (2025.01); *H10D 62/158* (2025.01); *H10D 62/371* (2025.01); *H10D 64/256* (2025.01); *H10D 84/85* (2025.01)

(56) References Cited

U.S. PATENT DOCUMENTS

| | | | | |
|---|---|---|---|---|
| 2020/0098756 | A1* | 3/2020 | Lilak | B82Y 10/00 |
| 2021/0408022 | A1* | 12/2021 | Young | H10B 51/30 |

OTHER PUBLICATIONS

"Office Action of Taiwan Counterpart Application", issued on Jun. 7, 2024, p. 1-p. 10.

* cited by examiner

MEMORY DEVICE AND MANUFACTURING METHOD THEREOF

CROSS-REFERENCE TO RELATED APPLICATION

This application claims the priority benefit of U.S. provisional application Ser. No. 63/409,243, filed on Sep. 23, 2022. The entirety of the above-mentioned provisional application is hereby incorporated by reference herein and made a part of this specification.

BACKGROUND

Technical Field

The present disclosure relates to a memory device and a manufacturing method thereof, and more particularly, to a memory device including storage capacitors with three-dimensional (3D) design as well as a method for manufacturing such memory device.

Description of Related Art

Dynamic random access memory (DRAM) is a comprehensively used volatile memory. Each DRAM cell includes an access transistor and a storage capacitor coupled to the access transistor. Key specifications in DRAM operation, such as noise margin, soft-error durability, operational speed and power consumption, are strongly dependent on capacitance of the storage capacitors. To maintain sufficient margin in DRAM operation, capacitance of the storage capacitors should be kept as large as possible against scaling of cell area. As an alternative, electrodes of the storage capacitors are formed as three-dimensional (3D) structures, rather than two-dimensional (2D) layers. In this way, capacitance per unit area can be increased for each storage capacitor. However, such improvement may be limited as result of possible bending or collapse of the 3D storage capacitors.

SUMMARY

In an aspect of the present disclosure, a memory device is provided. The memory device comprises: an access transistor, defined within an active region of a semiconductor substrate, wherein a recessed gate structure of the access transistor extends into the active region from above the active region, and source/drain contacts of the access transistor are disposed on the active region at opposite sides of the recessed gate structure; and a storage capacitor, disposed on the access transistor, and comprising: a composite bottom electrode, formed by alternately stacked first conductive layers and second conductive layers, wherein each second conductive layer is sandwiched between a pair of the first conductive layers, and tunnels laterally extend through the second conductive layers, respectively; a capacitor dielectric layer, covering inner and outer surfaces of the composite bottom electrode; and a top electrode, in contact with the composite bottom electrode through the capacitor dielectric layer.

In another aspect of the present disclosure, a memory device is provided. The memory device comprises: access transistors, defined within an active region of a semiconductor substrate, wherein recessed gate structures of the access transistors extend into the active region from above the active region, and source/drain contacts of the access transistors are disposed on the active region at opposite sides of each of the recessed gate structures; and storage capacitors, covering the access transistors, and comprising respective composite bottom electrodes, a shared capacitor dielectric layer wrapping all around the composite bottom electrodes and a common top electrode capacitively coupled to the composite bottom electrodes through the capacitor dielectric layer, wherein the composite bottom electrodes are each formed by alternately stacked first conductive layers and second conductive layers, each second conductive layer is sandwiched between a pair of the first conductive layers, and tunnels laterally extend through the second conductive layers, respectively.

In yet another aspect of the present disclosure, a method for manufacturing a memory device is provided. The method comprises: forming an access transistor within an active region of a semiconductor substrate, wherein a recessed gate structure of the access transistor extends into the active region from above the active region, and source/drain contacts of the access transistor are disposed on the active region at opposite sides of the recessed gate structure; and disposing a storage capacitor on the access transistor, comprising: forming a composite bottom electrode by alternately stacking first and second conductive layers and forming tunnels through the second conductive layers, respectively; forming a capacitor dielectric layer to cover inner and outer surfaces of the composite bottom electrode; and forming a top electrode entirely covering the capacitor dielectric layer.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
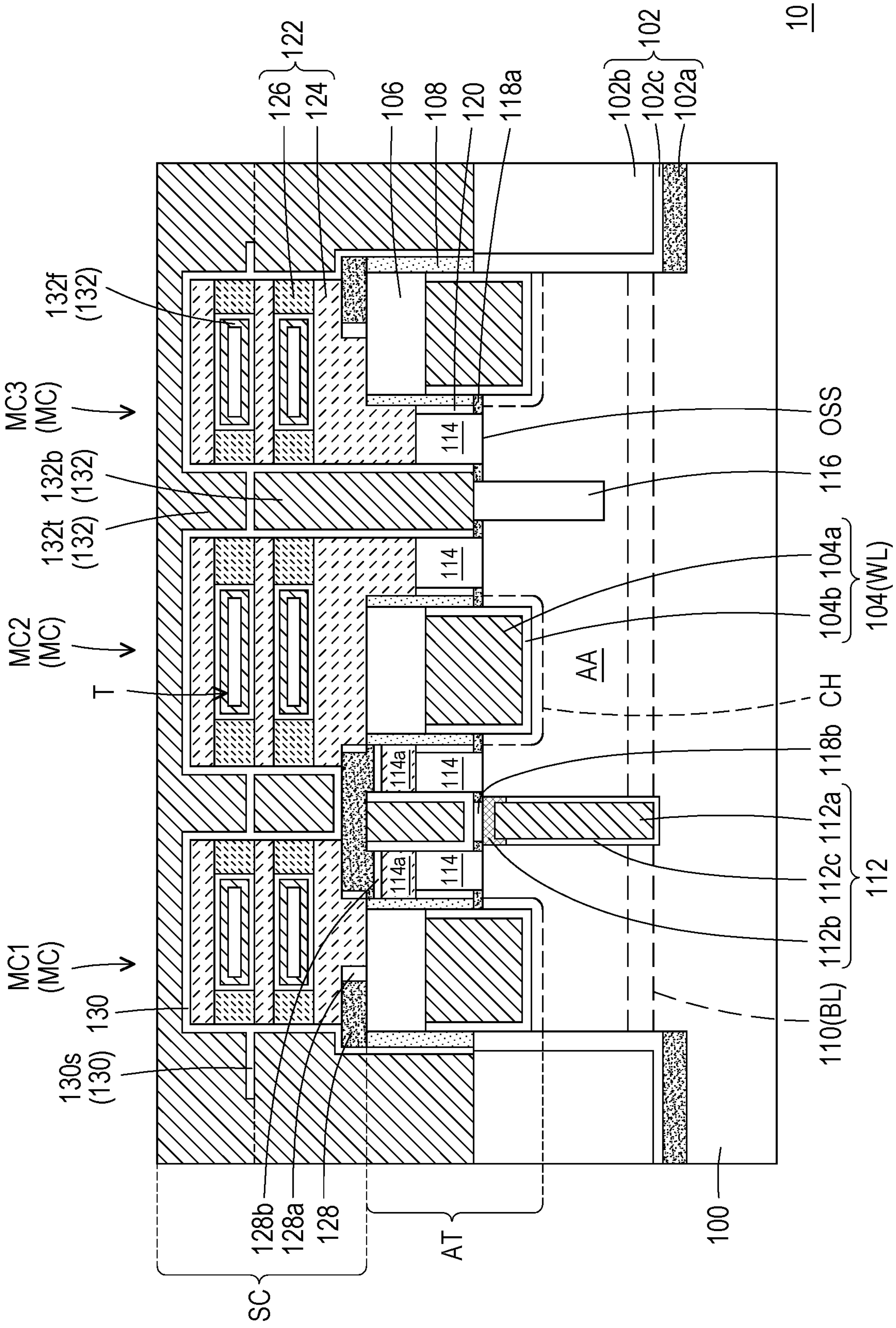
FIG. 1 is a schematic cross-sectional view illustrating some memory cells in a memory device, according to some embodiments of the present disclosure.

FIG. 1 is a schematic cross-sectional view illustrating an exemplary memory cell MC in a memory device 10 according to some embodiments of the present disclosure.

The memory device 10 as a DRAM may include an array of the memory cells MC. Each of the memory cells MC includes an access transistor AT and a storage capacitor SC disposed on the access transistor AT and formed with large capacitive coupling area. The access transistors AT are built on active regions AA of a semiconductor substrate 100, and some of the memory cells MC (i.e., memory cells MC1, MC2, MC3) arranged in the same row and having the access transistors AT sharing one of the active regions AA are shown in FIG. 1.

The access transistor AT and the storage capacitor SC in each memory cell MC are coupled to each other. More specifically, each storage capacitor SC formed with large surface area is coupled to a source/drain terminal of the corresponding access transistor AT, while the other source/drain terminal of each access transistor AT is coupled to a bit line BL. Further, a gate terminal of each access transistor AT is controlled by a word line WL. A plurality of the bit lines BL and a plurality of the word lines WL may be deployed for driving columns and rows of the memory cells MC. The access transistors AT in a column of the memory cells MC may be controlled by the same word line WL. On the other hand, according to some layout design, the access transistors AT in some of the memory cells MC arranged in a row may share one of the bit lines BL, while the access transistors AT in others of the memory cells MC arranged in this row may be connected to another one of the bit lines BL. No matter which layout design is used, each memory cell MC is defined at an intersection of one of the bit lines BL and one of the word lines WL, thus can be accessed independently.

When one of the memory cells MC is selected for programming, the access transistor AT in the selected memory cell MC is turned on by asserting the corresponding word line WL, and the storage capacitor SC in the selected memory cell MC is charged or discharged by a write voltage passed through the bit line BL connected to this access transistor AT. In addition, when one of the memory cells MC is subjected for reading, the connected bit line BL may be pre-charged, and the access transistor AT in the selected memory cell MC is turned on. In this way, this bit line BL may be pulled up or pulled down by the storage capacitor SC in the selected memory cell MC, depending on a charging state of this storage capacitor SC. By sensing voltage variation on this bit line BL, data stored in the storage capacitor SC of the selected memory cell MC can be sensed.

As shown in FIG. 1A, the active region AA is surrounded by a trench isolation structure 102 formed into the semiconductor substrate 100. According to some embodiments, the trench isolation structure 102 includes a bottom isolation layer 102*a*, an isolation structure 102*b* disposed on the bottom isolation layer 102*a* and an isolation liner 102*c* separating the isolation structure 102*b* from the bottom isolation layer 102*a* and the active regions AA.

The access transistor AT of each memory cell MC includes a recessed gate structure 104. Each recessed gate structure 104 may include a gate electrode 104*a* connected to the word line WL, and include a gate dielectric layer 104*b* covering a bottom surface and sidewalls of the gate electrode 104*a*. While an upper portion of each recessed gate structure 104 protrudes from an original semiconductor surface OSS of the semiconductor substrate 100, a lower portion of each recessed gate structure 104 is below the OSS, and a conduction channel CH can be established along the lower portion of each recessed gate structure 104. Opposite ends of the conduction channel CH in each access transistor AT are bounded to a pair of source/drain regions. Although not particularly depicted, these source/drain regions may be heavily doped.

According to some embodiments, each recessed gate structure 104 is capped by an insulating capping layer 106, and gate spacers 108 are formed along sidewalls of the insulating capping layers 106 and the protruding portions of the recessed gate structures 104. In these embodiments, the recessed gate structures 104 can be spaced apart from surrounding conductive components via the insulating capping layers 106 and the gate spacers 108.

While one of the source/drain regions of each access transistor AT is connected to the overlying storage capacitor SC, the other source/drain regions of each access transistor AT is connected to a conductive line 110 embedded in the semiconductor substrate 100. A plurality of the conductive lines 110 extend in the semiconductor substrate 100. In one embodiment the plurality of the conductive lines 110 are respectively functioned as one of the bit lines BL. In addition, adjacent ones of the access transistors AT may share the same conductive line 110. For instance, according to some layout design, the access transistors AT in the memory cells MC1, MC2 may share an underlying one of the conductive lines 110. This conductive line 110 is located in the trench isolation structure 102 which surrounds the active regions AA.

Contact plugs 112 extending into the active regions AA to reach the conductive lines 110 may be used for establishing connection between the access transistors AT and the conductive lines 110. As adjacent ones of the access transistors AT are neighbor to each other and connected to the same conductive line 110, they may share the same contact plug 112 disposed in between. For instance, the access transistors AT in the memory cells MC1, MC2 may be connected to the underlying conductive line 110 via one of the contact plugs 112 disposed in between these access transistors AT. According to some embodiments, each contact plug 112 includes a conductive plug 112*a*, a heavily doped semiconductor layer 112*b* capping a top portion of the conductive plug 112*a* and a barrier layer 122*c* wrapping rest portion of the conductive plug 112*a*. In these embodiments, the contact plugs 112 may be connected to the source/drain regions of the access transistors AT via the heavily doped semiconductor layers 112*b*, and may be connected to the conductive lines 110 via sidewalls of the conductive plugs 112*a*.

Further, source/drain contacts 114 may be disposed on the source/drain regions of the access transistors AT, respectively. A plurality of the insulting plugs 116 may be formed into the active regions AA, for providing electrical isolation between adjacent source/drain regions (and also the covering source/drain contacts 114) that are connected to different storage capacitors SC. In some embodiments, the source/drain contacts 114 are epitaxial structures. As an example, the source/drain contacts 114 may be formed of epitaxial silicon.

According to some embodiments, the active regions AA are respectively covered by a pad layer 118*a*. In these embodiments, the source/drain contacts 114 may extend through the pad layers 118*a*, to establish contact with the source/drain regions of the access transistors AT. In addition, the recessed gate structures 104 and the insulating plugs 116 may penetrate through the pad layers 118*a*, and extend into the active regions AA. Further, the gate spacers 108 may be underlined by the pad layers 118*a*. Also, in some embodiments, the contact plugs 112 are respectively covered by a pad layer 118*b*. Moreover, in some embodiments, the source/drain contacts 114 are in lateral contact with the gate spacers 108 through sidewall spacers 120, and the sidewall spacers 120 may be underlined by the pad layers 118*a*.

As described, the storage capacitors SC are disposed on the access transistors AT. Specifically, the storage capacitors SC respectively include a composite bottom electrode 122. The composite bottom electrode 122 includes alternately stacked first conductive layers 124 and second conductive layers 126. The second conductive layer 126 is sandwiched between a pair of the first conductive layers 124. In another view, the first conductive layer 124 is sandwiched between a pair of the second conductive layers 126. In addition, the second conductive layers 126 may have sufficient etching selectivity with respect to the first conductive layers 124, and can be selectively patterned with tunnels T. These tunnels T laterally extend through the second conductive layers 126, and are enclosed by the first conductive layers 124 and sidewall portions of the second conductive layers 126. As an example for achieving the etching selectivity, the first conductive layers 124 may be formed of N-type heavily doped silicon, whereas the second conductive layers 126 may be formed of N-type heavily doped silicon germanium.

Although each composite bottom electrode 122 is depicted as having a bottommost first conductive layer 124 and two pairs of the first and second conductive layers 124, 126 on top of the bottommost first conductive layer 124, each composite bottom electrode 122 may otherwise have more than two pairs of the first and second conductive layers 124, 126 on top of the bottommost first conductive layer 124. Those skilled in the art can adjust a stacking height of the composite bottom electrodes 122 according to process and/or design requirements, the present disclosure is not limited thereto. Moreover, in some embodiments, the topmost first conductive layer 124 in each composite bottom electrode 122 is thicker than other first conductive layers 124 (except for the bottommost first conductive layer 124).

The bottommost first conductive layer 124 in the composite bottom electrode 120 of each storage capacitor SC may further extend to establish contact with one of the source/drain contacts 114 of the underlying access transistor AT, while being blocked from the other source/drain contact 114 of this access transistor AT. Insulating blocking patterns 128 may be disposed over the recessed gate structures 104 for cutting electrical connection between each bottommost first conductive layer 124 and one of the source/drain contacts 114 of the underlying access transistor AT. For instance, in the memory cell MC2, the bottommost first conductive layer 124 extends to a top end of one of the source/drain contacts 114, and is blocked from the other source/drain contact 114 via one of the insulating blocking patterns 128. Similarly, in the memory cell MC1, the bottommost first conductive layer 124 may extend to a top end of one of the source/drain contacts 114 (not shown in the cross-sectional view of FIG. 1), but blocked from the other source/drain contact 114 via one of the insulating blocking patterns 128.

According to some embodiments, the source/drain contacts 114 connecting to the conductive lines 110 but separated from the overlying first conductive layers 124 are covered by extended source/drain contacts 114*a*, and the extended source/drain contacts 114*a* are spaced apart and electrically isolated from the overlying first conductive layers 124 via the insulating blocking patterns 128. The extended source/drain contacts 114*a* may be made of silicon formed by selective growth.

In addition, in some embodiments, the insulating blocking patterns 128 are in lateral contact with the bottommost first conductive layers 124 via sidewall spacers 128*a*, and are in contact with the extended source/drain contacts 114*a* via lining layers 128*b*. The sidewall spacers 128*a* and the lining layers 128*b* are formed of an insulating material as well. For instance, the insulating blocking patterns 128, the sidewall spacers 128*a* and the lining layers 128*b* may be formed of silicon oxide.

While having separated composite bottom electrodes 122, adjacent storage capacitors SC may share a capacitor dielectric layer 130. The capacitor dielectric layer 130 conformally covers surfaces of the composite bottom electrodes 122, including surfaces of the tunnels T laterally extending through the second conductive layers 126 of the composite bottom electrodes 122. In addition, the capacitor dielectric layer 130 may further extend to cover sidewalls of the source/drain contacts 114 connected to the composite bottom electrodes 122, and to cover portions of the insulating blocking patterns 128. In some embodiments, a high-k dielectric material is used for forming the capacitor dielectric layer 130.

In addition, the storage capacitors SC may share a common top electrode 132. The common top electrode 132 may entirely cover the capacitor dielectric layer 130. Particularly, film portions 132*f* of the common top electrode 132 are formed in the tunnels T. As compared to capacitor electrodes without tunnel design, the composite bottom electrodes 122 formed with the tunnels T can have improved surface area to volume ratio, and the storage capacitors SC with significantly increased capacitance are resulted.

According to some embodiments, the film portions 132*f* of the common top electrode 132 do not fill up the tunnels T. In these embodiments, air gaps may be sealed in these tunnels T. In alternative embodiments, the film portions 132*f* of the common top electrode 132 fill up the tunnels T. In these alternative embodiments, there might not be any air gap enclosed in the tunnels T.

Further, in some embodiments, portions of the common top electrode 132 outside the composite bottom electrodes 122 have a lower part 132*b* and an upper part 132*t*. In these embodiments, the capacitor dielectric layer 130 may have a spacer portion 130*s* laterally extending from sidewall portions covering outer sidewalls of the composite bottom electrodes 122. The lower part 132*b* of the common top electrode 132 lies below the spacer portion 130*s* of the capacitor dielectric layer 130, whereas the upper part 132*t* of the common top electrode 132 is disposed on top of the spacer portion 130*s* of the capacitor dielectric layer 130 and connected to the lower part 132*b* of the common top electrode 132 from outside the span of the spacer portion 130*s* of the capacitor dielectric layer 130. That is, the spacer portion 130*s* of the capacitor dielectric layer 130 extends in between the lower part 132*b* and the upper part 132*t* of the common top electrode 132, but does not completely separate the lower part 132*b* and the upper part 132*t* of the common top electrode 132 from each other.

As described, owing to the tunnel design, the composite bottom electrodes 122 can be formed with high surface area to volume ratio. Therefore, between the common top electrode 132 and the composite bottom electrodes 122, there is a very large capacitive coupling area, even when a height of the composite bottom electrodes 122 is not aggressively increased. In other words, the resulted storage capacitors SC can achieve high capacitance without risking bending or collapse of the composite bottom electrodes 122.

Figure 2:
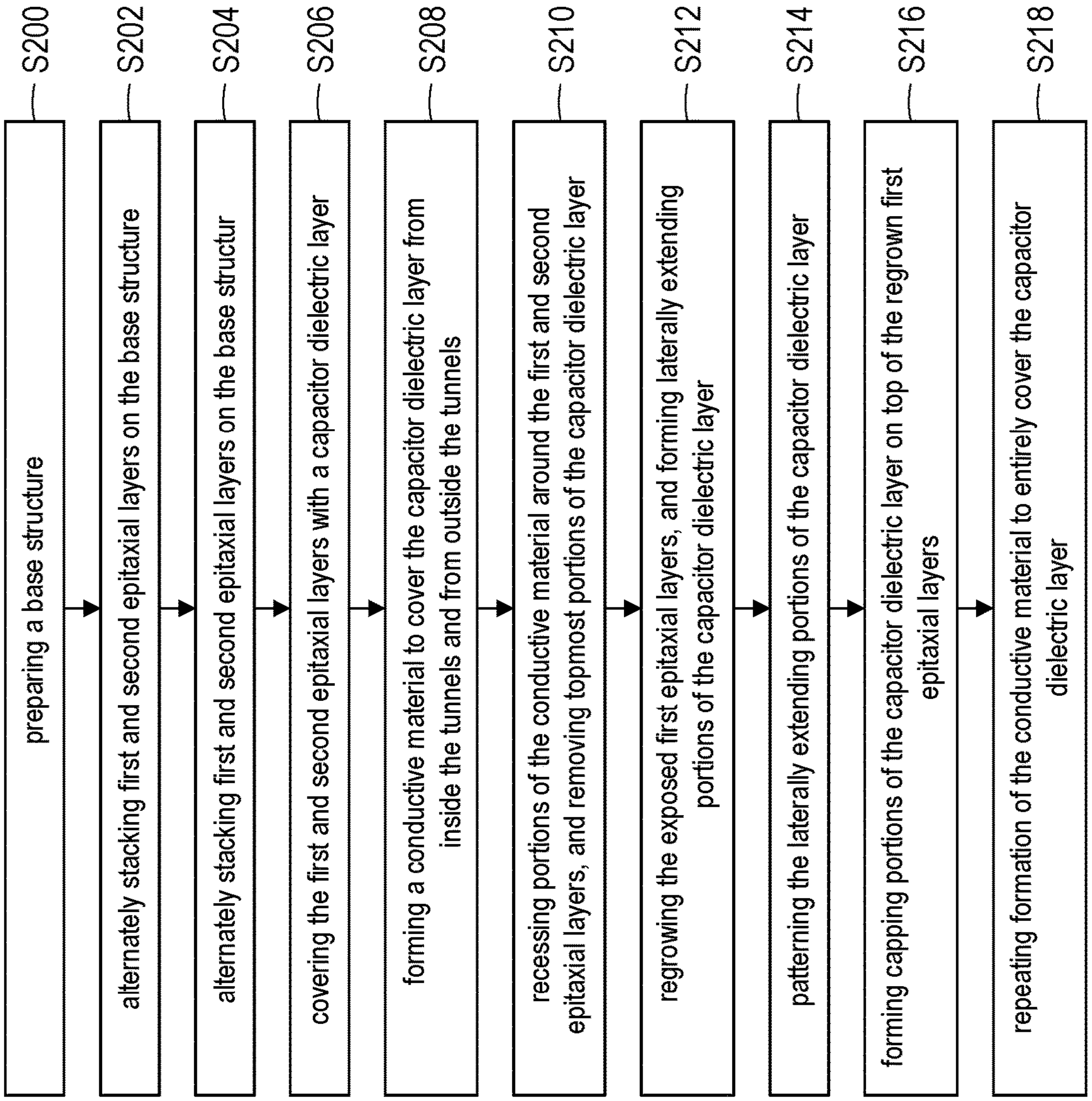
FIG. 2 is a flow diagram illustrating a method for forming the memory device, according to some embodiments of the present disclosure.

FIG. 2 is a flow diagram illustrating a method for forming the memory device 10, according to some embodiments of the present disclosure. FIG. 3A through FIG. 3I are schematic cross-sectional views illustrating structures at various stages during the manufacturing process as shown in FIG. 2.

Figure 3A:
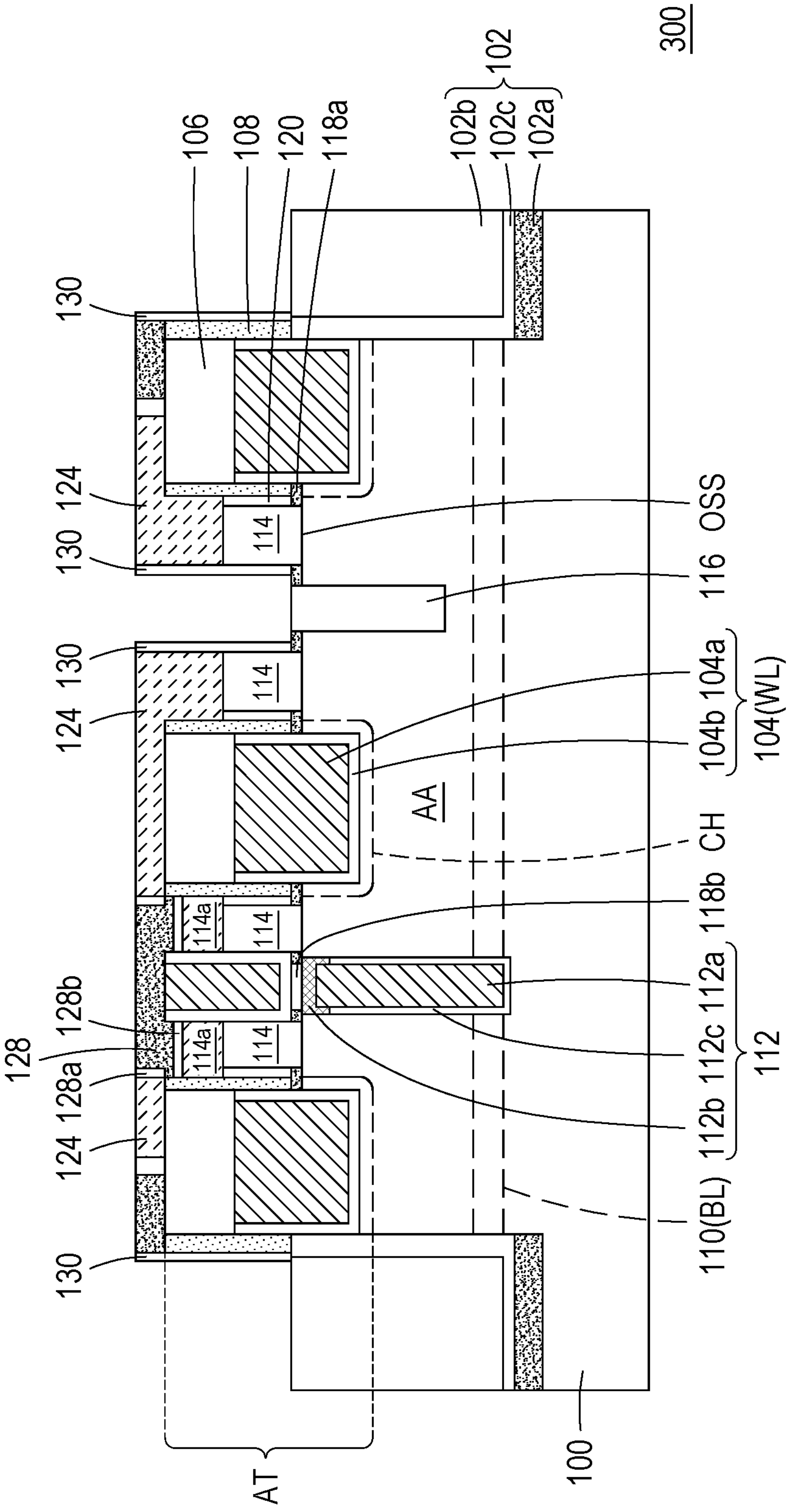
FIG. 3A through FIG. 3I are schematic cross-sectional views illustrating structures at various stages during the manufacturing process as shown in FIG. 2.

Referring to FIG. 2 and FIG. 3A, at a step S200, a base structure 300 for the storage capacitors SC is prepared. Specifically, the base structure 300 includes the access transistors AT, the conductive lines 110, the contact plugs 112 and the insulating plugs 116. Along with other components, the base structure 300 further includes the insulating blocking patterns 128 and a bottom part of the storage capacitors SC. In following steps, rest portion of the storage capacitors SC are formed on the base structure 300.

According to some embodiments, preparation of the base structure 300 includes forming the trench isolation structure 102 into the semiconductor substrate 100, to define the active regions AA. Thereafter, the conductive lines 110 are formed in the trench isolation structure 102, and the contact plugs 112 are formed in the active regions AA. Also, the recessed gate structures 104 are formed into the active regions AA. In the meantime, the insulating capping layers 106 covering the recessed gate structures 104 are formed. Subsequently, the gate spacers 108 are formed around the recessed gate structures 104 and the insulating capping layers 106. The source/drain contacts 114 and the sidewall spacers 120 are then disposed around the recessed gate structures 104.

Afterwards, the source/drain contacts 114 (could be deemed as part of source/drain), the extended source/drain contacts 114*a* and bottom portions of the bottommost first conductive layers 124 of the composite bottom electrodes 122 could be formed by a selective epitaxial growth method. In addition, a dielectric layer may be formed along top surfaces of the contact plugs 112 as well as exposed sidewalls of the source/drain contacts 114, the epitaxial structures and the gate spacers 108, to form a bottom part of the capacitor dielectric layer 130. The detailed description to form the base structure 300 could refer to U.S. patent application Ser. No. 17/308,071, filed on May 5, 2021, Title: MEMORY CELL STRUCTURE WITH CAPACITOR OVER TRANSISTOR, and all content of which is incorporated herein by reference.

Figure 3B:
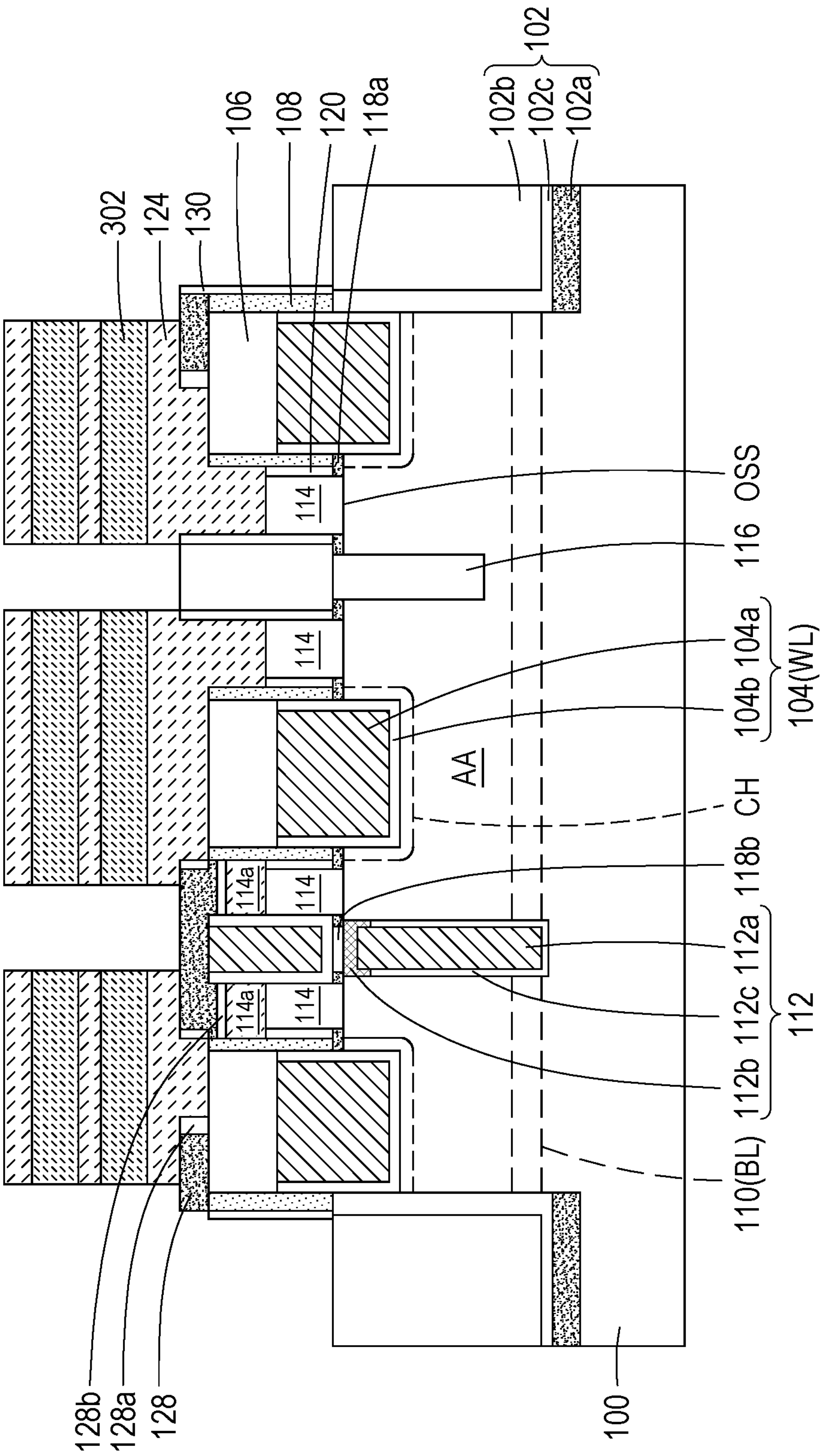

Referring to FIG. 2 and FIG. 3B, at a step S202, first and second epitaxial layers are alternately stacked on the base structure 300. The bottommost first epitaxial layers and the underlying epitaxial structures collectively form the bottommost first conductive layers 124, and other first epitaxial layers form the rest first conductive layers 124. On the other hand, the second epitaxial layers form initial second conductive layers 302, which will be patterned to form the second conductive layers 126. Consecutive selective epitaxial growth processes may be involved for forming the first and second epitaxial layers, such that the resulted first conductive layers 124 and the initial second conductive layers 302 can be selectively grown from the exposed epitaxial structures of the base structure 300.

Figure 3C:
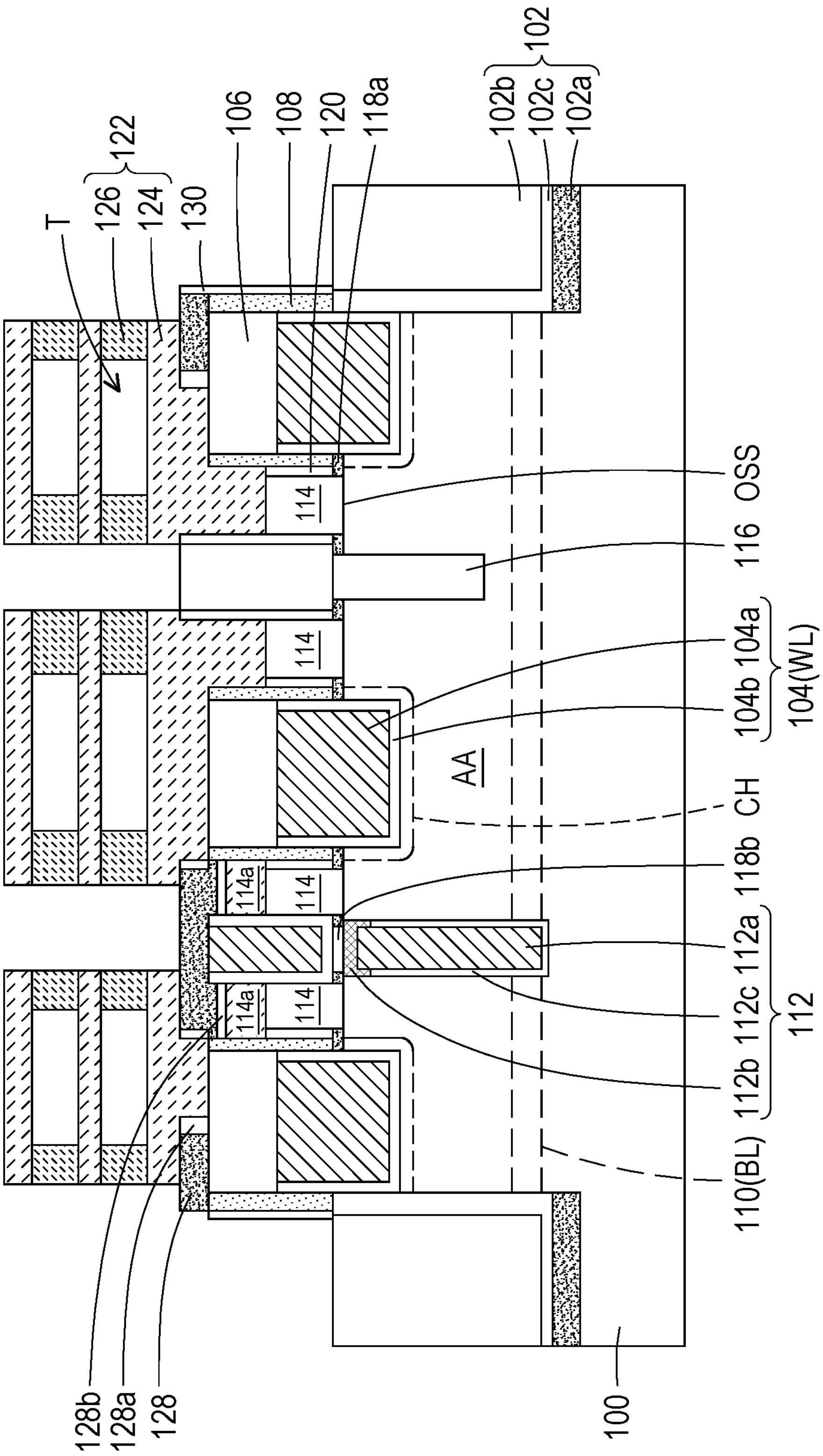

Referring to FIG. 2 and FIG. 3C, at a step S204, the tunnels T are formed through the initial second conductive layers 302. As a result, the initial second conductive layers 302 are patterned to form the second conductive layers 126 with the tunnels T. Currently, the first conductive layers 124 and the second conductive layers 126 are both formed, and the composite bottom electrodes 122 are defined.

Preliminarily, mask patterns (not shown) may be formed to shield portions of the initial second conductive layers 302 from being removed during formation of the tunnels T. That is, the mask patterns may cover opposite sidewall portions of the initial second conductive layers 302, while exposing central portions of the initial second conductive layers 302. As an example, the mask patterns may be photoresist patterns. After formation of the mask patterns, an etching process is performed to remove the exposed central portions of the initial second conductive layers 302, for forming the tunnels T. The covered sidewall portions of the initial second conductive layers 302 remain to form the second conductive layers 126. As a material of the first conductive layers 124 (e.g., N-type heavily doped silicon) has sufficient etching selectivity with respect to a material of the initial second conductive layers 302 and the conductive layers 126 (e.g., N-type heavily doped silicon germanium), the first conductive layers 124 may be barely etched (or may not be etched at all), thus may not be patterned during formation of the tunnels T. Following the etching process, the mask patterns may be removed by a stripping process.

Figure 3D:
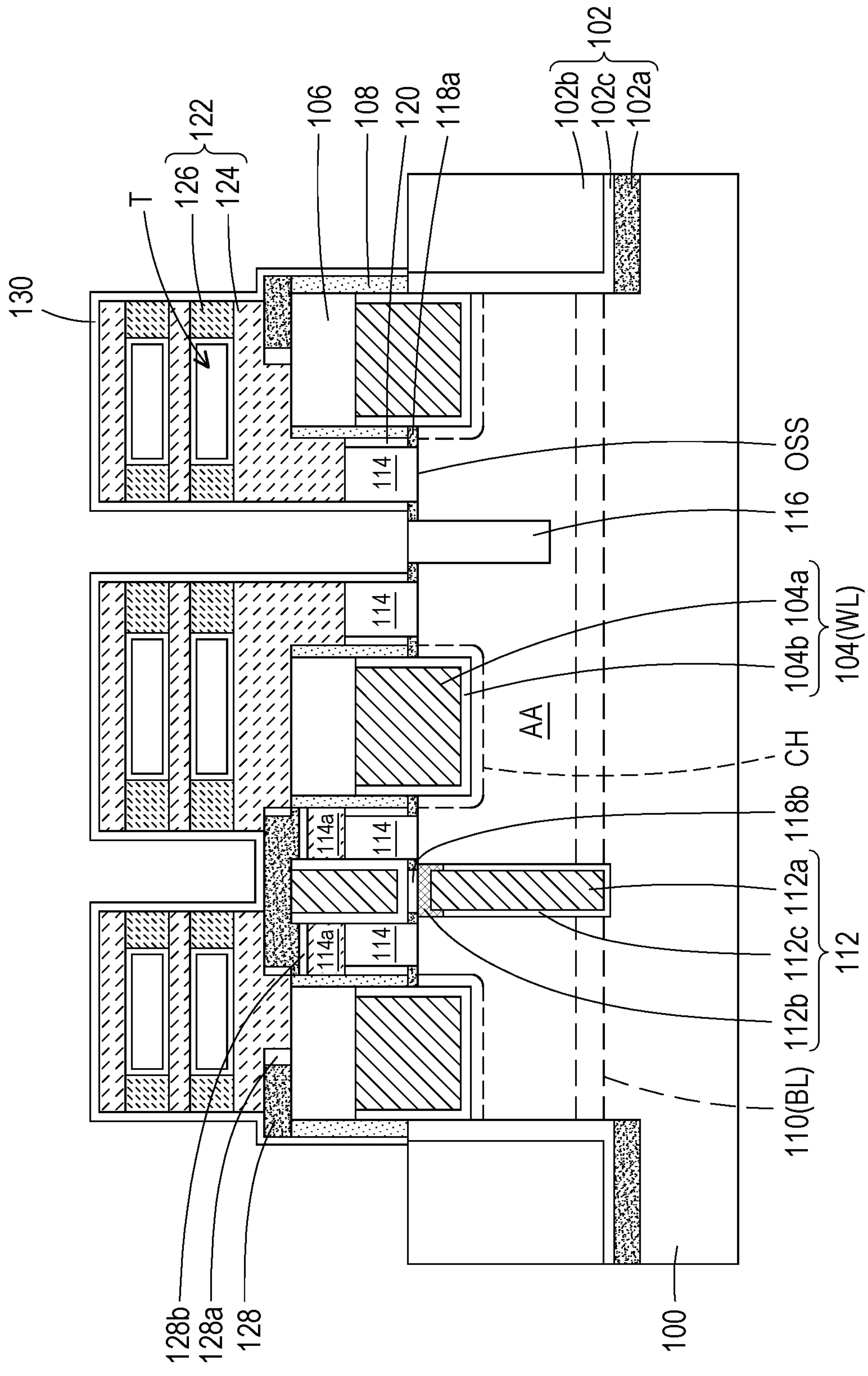

Referring to FIG. 2 and FIG. 3D, at a step S206, a dielectric layer is formed along exposed surfaces of the composite bottom electrodes 122 and the insulating blocking patterns 128, for forming portions of the capacitor dielectric layer 130 covering the composite bottom electrodes 122 and the insulating blocking patterns 128. As described, the capacitor dielectric layer 130 wraps all around the composite bottom electrodes 122 by a conformal manner. That is, the tunnels T are lined with the capacitor dielectric layer 130, but are not filled up by the capacitor dielectric layer 130. Therefore, subsequently formed common top electrode 132 can fill into the tunnels T, and can be capacitively coupled to the composite bottom electrodes 122 from inside. In order to achieve conformity of the capacitor dielectric layer 130, an atomic layer deposition (ALD) process may be used for forming such dielectric layer.

Figure 3E:
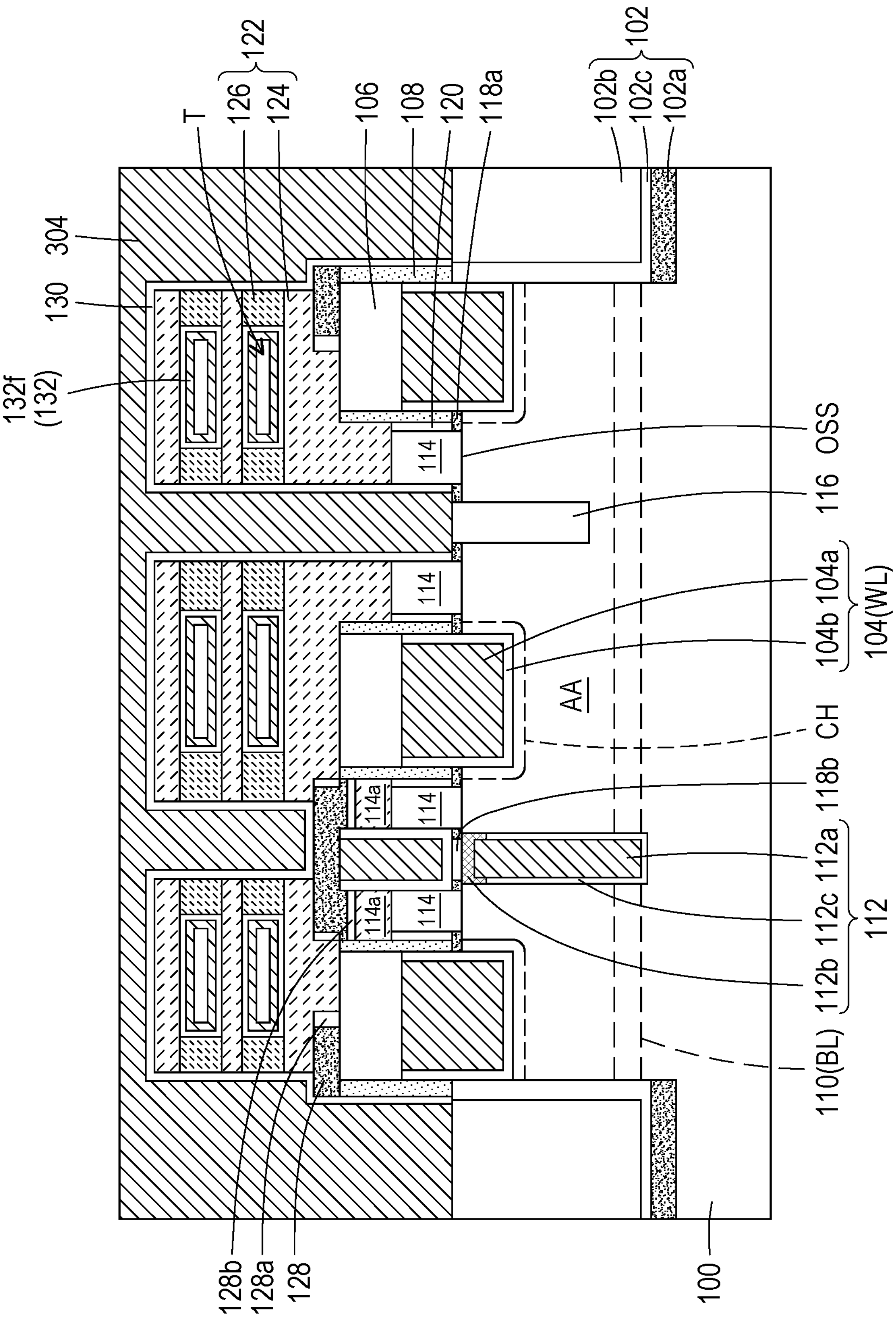

Referring to FIG. 2 and FIG. 3E, at a step S208, a conductive material 304 is provided on the current structure. The conductive material 304 may extend into the tunnels T, to form the film portions 132*f* of the common top electrode 132. Also, the conductive material 304 may cover the capacitor dielectric layer 130 from outside the composite bottom electrodes 122. Formation of the conductive material 304 may include performing an ALD process for forming portions of the conductive material 304 as the film portions 132*f* of the common top electrode 132, and performing another deposition process (e.g., a chemical vapor deposition (CVD) process, a physical vapor deposition (PVD) process or the like), a plating process or a combination thereof for forming other portions of the conductive material 304 from a top surface of the trench isolation structure 102 to a height over topmost portions of the capacitor dielectric layer 130. In addition, a possible etch back process may be used for adjusting a height of a topmost surface of the conductive material 304.

Figure 3F:
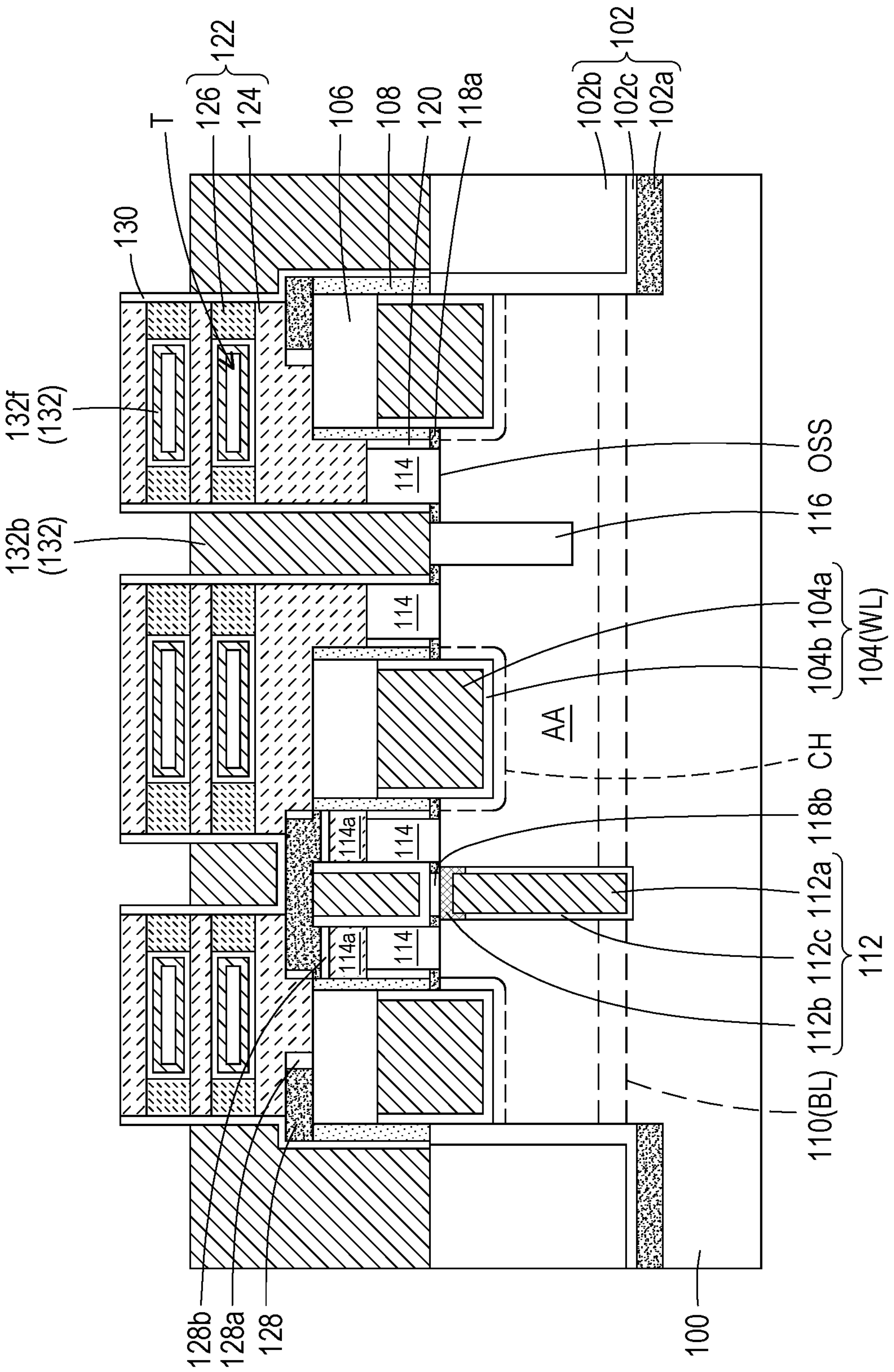

Referring to FIG. 2 and FIG. 3F, at a step S210, portions of the conductive material 304 outside the composite bottom electrodes 122 are recessed, and portions of the capacitor dielectric layer 130 lying on top of the topmost first conductive layers 124 are removed. As a result, the lower part 132*b* of the common top electrode 132 is formed by portions of the conductive material 304 remained around the composite bottom electrodes 122, and the topmost first conductive layers 124 are exposed due to the partial removal of the capacitor dielectric layer 130. According to some embodiments, an etching back process may be performed for recessing the conductive material 304, and a following anisotropic etching process may be performed for exposing the topmost first conductive layers 124. As the portions of the conductive material 304 in the tunnels T (i.e., the film portions 132*f* of the common top electrode 132) are mostly shielded by the composite bottom electrodes 122, these portions of the conductive material 304 may be barely removed during the etching processes.

Figure 3G:
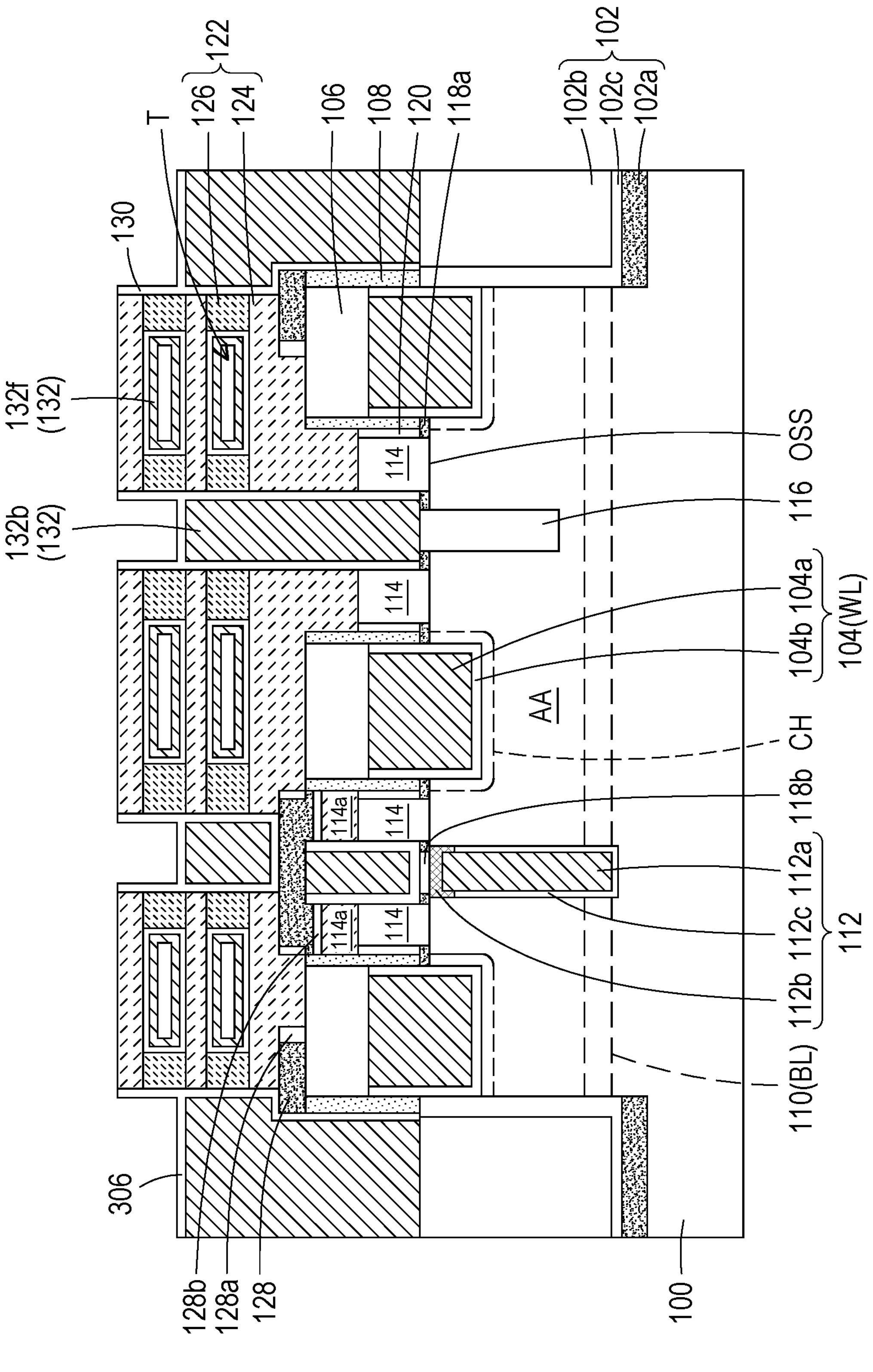

Referring to FIG. 2 and FIG. 3G, at a step S212, the topmost first conductive layers 124 are re-grown from the exposed surfaces, and the lower part 132*b* of the common top electrode 132 is covered by a dielectric layer 306. As a result of the regrowth, the topmost first conductive layers 124 may become greater in thickness, as compared to other first conductive layers 124 (except for the bottommost first conductive layers 124). In addition, the dielectric layer 306 may laterally extend from the portions of the capacitor dielectric layer 130 covering the composite bottom electrodes 122 from outside, and will be patterned in the following step, for forming the spacer portions 130*s* of the capacitor dielectric layer 130. A selective epitaxial growth process may be involved for the regrowth of the topmost first conductive layers 124. On the other hand, a deposition process (e.g., a CVD process or an ALD process) may be used for forming the dielectric layer 306.

Figure 3H:
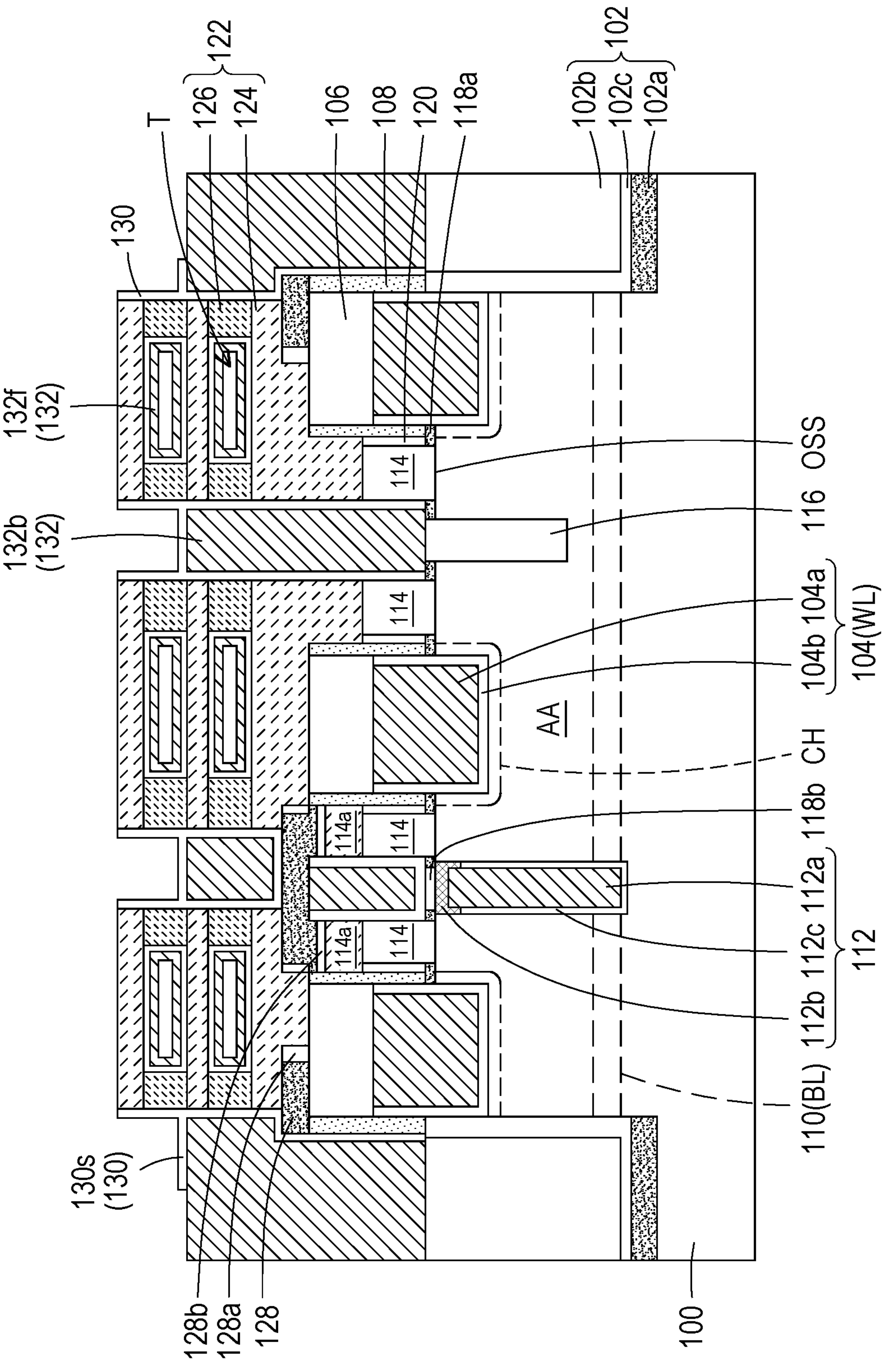

Referring to FIG. 2 and FIG. 3H, at a step S214, the dielectric layer 306 is patterned to form the spacer portions 130*s* of the capacitor dielectric layer 130. Specifically, some portions of the dielectric layer 306 peripheral to the composite bottom electrodes 122 (or some portions of the dielectric layer 306 between groups of the composite bottom electrodes 122) are removed, and remained portions of the dielectric layer 306 form the spacer portions 130*s* of the capacitor dielectric layer 130. As result of the patterning operation, the lower part 132*b* of the common top electrode 132 can be partially exposed, thus can be connected to the upper part 132*t* of the common top electrode 132 to be formed in the following step. A lithography process and a following etching process may be used for patterning the dielectric layer 306 to form the spacer portions 130*s* of the capacitor dielectric layer 130.

Figure 3I:
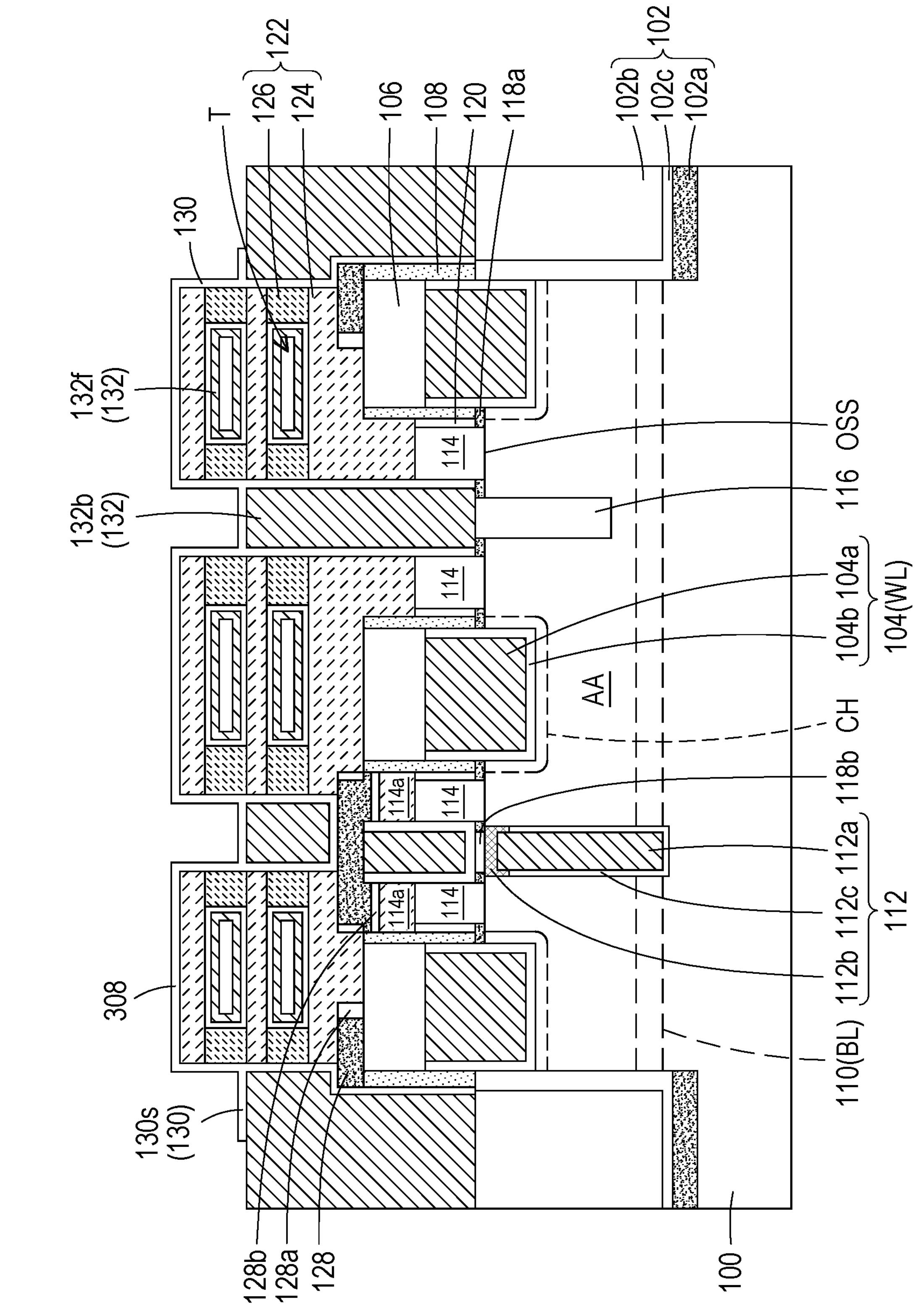

Referring to FIG. 2 and FIG. 3I, at a step S216, dielectric layers 308 are formed on the topmost first conductive layers 124, to form capping portions of the capacitor dielectric layer 130. Accordingly, the topmost first conductive layers 124, which are previously exposed, are once again covered. In addition, formation of the capacitor dielectric layer 130 may have been completed since formation of the dielectric layers 308. According to some embodiments, mask patterns (e.g., photoresist patterns) may be used for defining locations of the dielectric layers 308, then the dielectric layers 308 are deposited on the specified regions. After the deposition, the mask patterns may be removed.

Referring to FIG. 2 and FIG. 1A, at a step S218, a conductive material is formed on the current structure. Such conductive material entirely covers exposed portions of the capacitor dielectric layer 130 and connects to the lower part 132*b* of the common top electrode 132, to form the upper part 132*t* of the common top electrode 132. According to some embodiments, formation of such conductive material includes a deposition process (e.g., a CVD process, a PVD process or the like), a plating process or a combination thereof, and may further include an etch back process for adjusting a height of a topmost surface of such conductive material.

Up to here, the memory device 10 partially shown in FIG. 1A has been formed. It should be understood that, the memory device 10 may be further processed to form overlying metallization layers for routing the memory device 10.

Figure 4A:
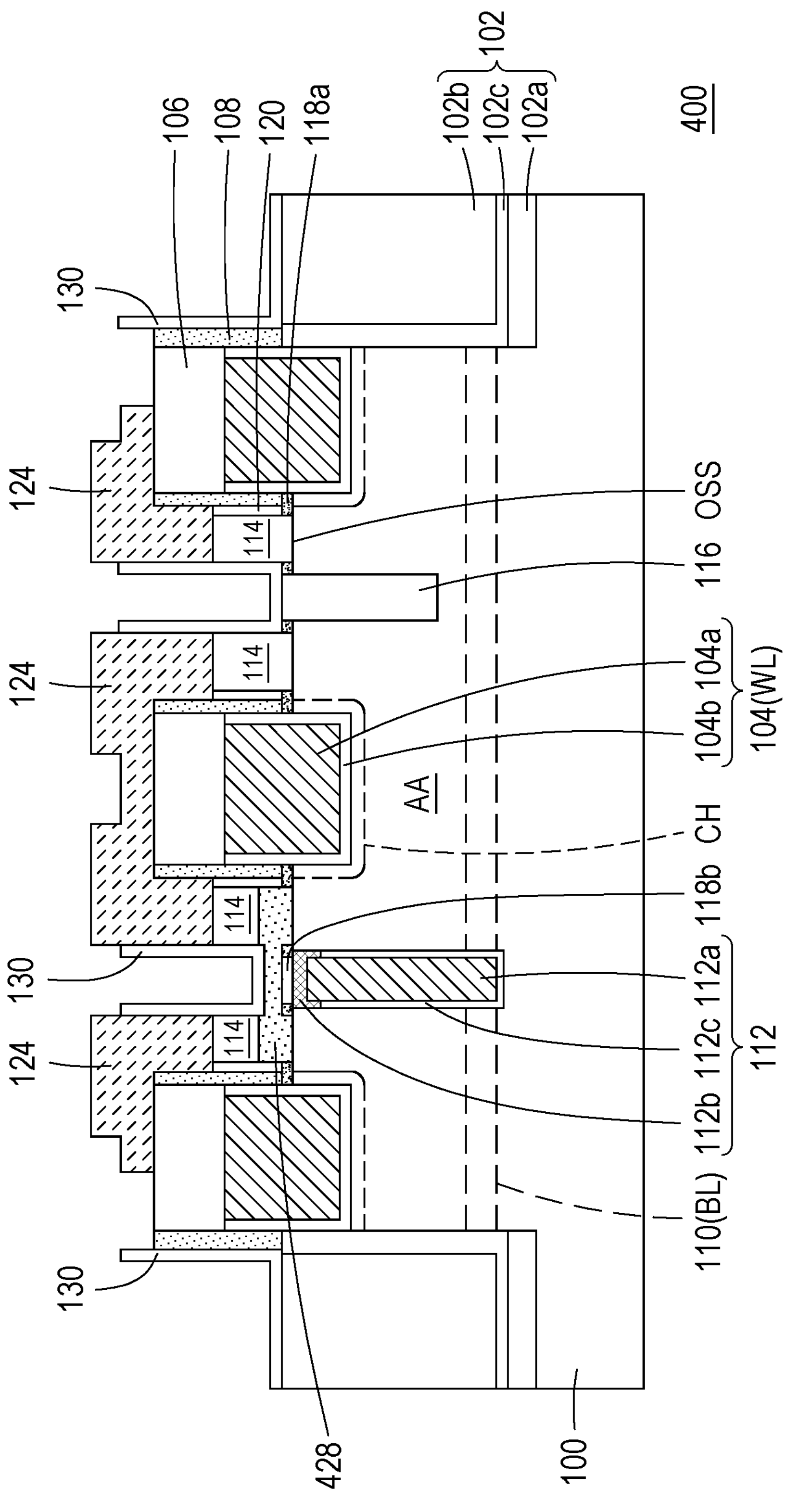
FIG. 4A is a schematic cross-sectional view illustrating a base structure for forming a memory device, according to some other embodiments of the present disclosure.

According to an alternative manufacturing process, the dielectric layer 306 shown in FIG. 3G may further cover exposed surfaces of the topmost first conductive layers 124, for forming the capping portions of the capacitor dielectric layer 124 before the patterning step shown in FIG. 3H. In this way, formation of the dielectric layer 308 as shown in FIG. 3I may be omitted. In another embodiment, a different base structure 400 for the storage capacitors SC is prepared, as shown in FIG. 4A. The base structure 400 also includes the access transistors AT, the conductive lines 110, the contact plugs 112 and the insulating plugs 116. Along with other components, the base structure 300 further includes insulating blocking patterns 428 and a bottom part of the storage capacitors SC.

Figure 4B:
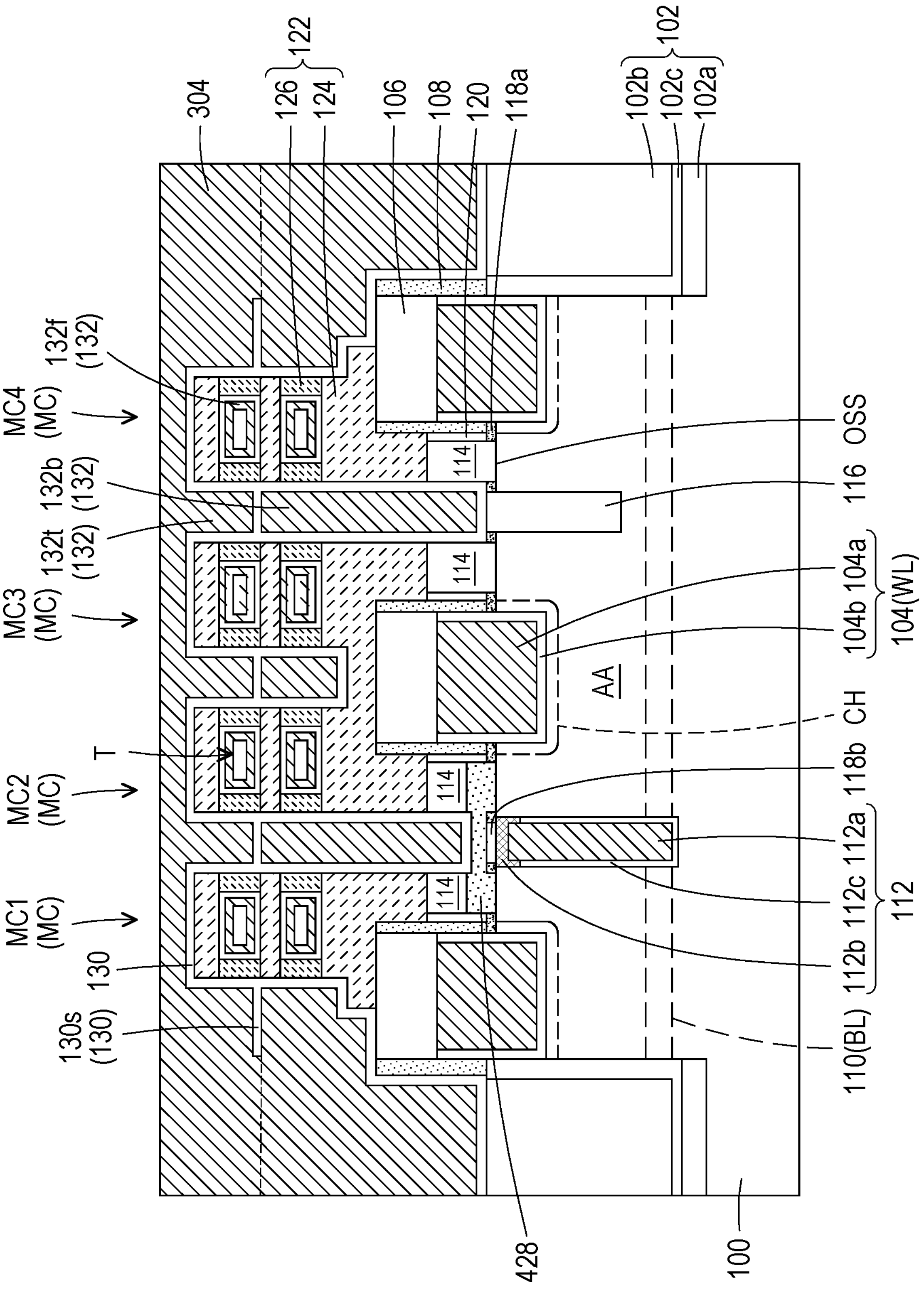
FIG. 4B is a schematic cross-sectional view illustrating the memory device built from the base structure shown in FIG. 4A.

According to some embodiments, preparation of the base structure 400 includes forming the trench isolation structure 102 into the semiconductor substrate 100, to define the active regions AA. Thereafter, the conductive line 110 is formed in the trench isolation structure 102, and the contact plug 112 is formed in the active regions AA. Also, the recessed gate structures 104 are formed into the active regions AA. In the meantime, the insulating capping layers 106 covering the recessed gate structures 104 are formed. Subsequently, the gate spacers 108 are formed around the recessed gate structures 104 and the insulating capping layers 106. The source/drain contacts 114 and the sidewall spacers 120 are then disposed around the recessed gate structures 104. Afterwards, source/drain contacts 114 (could be deemed as part of source/drain), and bottom portions of the bottommost first conductive layers 124 of the composite bottom electrodes 122 could be formed by selective growth method. The detailed description to form the base structure 300 could refer to U.S. patent application Ser. No. 17/337,391, filed on Jun. 2, 2021, Title: MEMORY CELL STRUCTURE, and all content of which is incorporated herein by reference. Then, the previous steps S202-S218 (or step 216 of formation of the dielectric layer 308 as shown in FIG. 31 may be omitted as described) could be applied to the base structure 400 and a memory device shown in FIG. 4B has been formed.

As above, a memory device and a manufacturing method thereof are provided. The memory device as a DRAM includes memory cells respectively having an access transistor and a storage capacitor coupled to the access transistor. Among other features, a composite bottom electrode of the storage capacitor includes alternately stacked first and second conductive layers. Each second conductive layer is sandwiched between a pair of the first conductive layers, and tunnels are formed through the second conductive layers, respectively. As such, a capacitor dielectric layer and a top electrode of the storage capacitor not only cover the composite bottom electrode from outside, but also in contact with the composite bottom electrode from the internal tunnels. In this way, the capacitor dielectric layer and the top electrode wrap all around the composite bottom electrode, and the top electrode is capacitively coupled to the composite bottom electrode from both outside and inside. Therefore, owing to the tunnel design, the top electrode can be coupled to the composite bottom electrode by a very large capacitive coupling area, even when a height of the composite bottom electrode is not aggressively increased. In other words, the storage capacitor can achieve high capacitance without risking bending or collapse.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A memory device, comprising:

an access transistor, defined within an active region of a semiconductor substrate; and a storage capacitor, disposed on the access transistor, and comprising:

a composite bottom electrode, formed by alternately stacked first conductive layers and second conductive layers, wherein each second conductive layer is sandwiched between a pair of the first conductive layers, and tunnels are in the second conductive layers, respectively;

a capacitor dielectric layer, covering the composite bottom electrode; and a top electrode in contact with the capacitor dielectric layer.

2. The memory device according to claim 1, wherein the capacitor dielectric layer conformally covers surfaces of the tunnels, and the top electrode extends into the tunnels.

3. The memory device according to claim 1, wherein portions of the top electrode in the tunnels are conformal to surfaces of the tunnels.

4. The memory device according to claim 3, wherein air gaps are formed in the tunnels.

5. The memory device according to claim 1, wherein the tunnels are filled up by the capacitor dielectric layer and the top electrode.

6. The memory device according to claim 1, wherein the first and second conductive layers are epitaxial layers, and have etching selectivity with respect to each other.

7. The memory device according to claim 1, wherein a bottommost one of the first conductive layers caps the access transistor.

8. The memory device according to claim 7, wherein the bottommost one of the first conductive layers is connected to a first source/drain contact of the access transistor, and blocked from a second source/drain contact of the access transistor via an insulating structure.

9. The memory device according to claim 1, the first conductive layers are made of Si, and the second conductive layers are made of SiGe.

10. The memory device according to claim 1, wherein a recessed gate structure of the access transistor extends into the active region, and source/drain contacts of the access transistor are disposed on the active region at opposite sides of the recessed gate structure.

11. The memory device according to claim 1, wherein a source/drain contact of the access transistor isolated from the composite bottom electrode is connected to a bit line under an original semiconductor surface of the semiconductor substrate.

12. The memory device according to claim 11, wherein the source/drain contact is connected to the bit line through a contact plug extending into the active region.

13. A memory device, comprising:

access transistors, defined within an active region of a semiconductor substrate; and storage capacitors, covering the access transistors, and comprising respective composite bottom electrodes, a shared capacitor dielectric layer wrapping all around the composite bottom electrodes and a common top electrode capacitively coupled to the composite bottom electrodes through the capacitor dielectric layer, wherein the composite bottom electrodes are each formed by alternately stacked first conductive layers and second conductive layers, each second conductive layer is sandwiched between a pair of the first conductive layers, and tunnels are in the second conductive layers, respectively.

14. The memory device according to claim 13, wherein the first and second conductive layers are epitaxial layers, and have etching selectivity with respect to each other.

15. The memory device according to claim 14, wherein the first conductive layers are made of Si, and the second conductive layers are made of SiGe.

16. A method for manufacturing a memory device, comprising:

forming an access transistor within an active region of a semiconductor substrate; and disposing a storage capacitor on the access transistor, comprising:

forming a composite bottom electrode by alternately stacking first and second conductive layers and forming tunnels through the second conductive layers, respectively;

forming a capacitor dielectric layer to cover the composite bottom electrode; and forming a top electrode entirely covering the capacitor dielectric layer.

17. The method for manufacturing the memory device according to claim 16, wherein a selective epitaxial growth process is involved in formation of the first and second conductive layers.

18. The method for manufacturing the memory device according to claim 16, wherein a bottommost one of the first conductive layers is grown from a top end of a first source/drain contact of the source/drain contacts.

* * * * *